United States Patent [19]

Kryder et al.

[11] Patent Number: 4,800,457
[45] Date of Patent: Jan. 24, 1989

[54] MAGNETORESISTIVE SENSOR ELEMENT

[75] Inventors: Mark Kryder, Bradford Woods; William C. Cain, West Mifflin, both of Pa.; William H. Meiklejohn, Scotia, N.Y.

[73] Assignee: Carnegie-Mellon University, Pittsburgh, Pa.

[21] Appl. No.: 102,426

[22] Filed: Sep. 29, 1987

[51] Int. Cl.⁴ .............................................. G11B 5/39
[52] U.S. Cl. .................................................... 360/113
[58] Field of Search ...................... 360/113; 338/32 R; 324/252

[56] References Cited

U.S. PATENT DOCUMENTS

4,488,194  12/1984  Michel ................................. 360/113
4,639,806   1/1987  Kira et al. ........................... 360/113
4,686,472   8/1987  Van Ooijen et al. ................ 360/113

Primary Examiner—Robert S. Tupper
Attorney, Agent, or Firm—Reed Smith Shaw & McClay

[57] ABSTRACT

A magnetoresistive sensor which includes an element having a first layer that exhibits a magnetoresistive response, a second layer that magnetically biases the first layer and is in contact therewith, and possibly a substrate that contacts the first layer, with the first layer disposed between the second layer and the substrate. Of course, the first and second layers are interchangeable. Adjoining a side of the second layer is an anode contact and a cathode contact. The anode contact and the cathode contact are positioned on the side of the second layer such that they do not contact each other.

17 Claims, 7 Drawing Sheets

MAGNETORESISTIVE SENSOR ELEMENT

FIELD OF THE INVENTION

The present invention relates to magnetoresistive readback elements. More specifically, the present invention relates to magnetoresistive readback elements made out of rare earth transition metals.

BACKGROUND OF THE INVENTION

A magnetoresistive readback (MR) head as described in Robert P. Hunt, "A Magnetoresistive Readout Transducer", *IEEE Transactions on Magnetics*, Vol. MAG-7, March 1971, pp. 150–154; and David A. Thompson, Lubomyr T. Romankiw, and A. F. Mayadas, "Thin Film Magnetoresistors in Memory, Storage and Related Applications", *IEEE Transactions on Magnetics*, Vol. MAG-11, July 1975, pp. 1039–1049, detects magnetic fields through the resistance changes of the magnetoresistive material. MR heads are of interest for three main reasons: the voltage output when detecting recorded flux transitions in a magnetic medium is large and proportional to the applied sense current; good linear density resolution can be obtained; and the MR head senses flux ($\phi$) as compared to an inductive head which senses the time rate of change of flux, $d\phi/dt$, making the MR output independent of the relative velocity between sensor and medium. A more complete discussion of the magnetoresistive effect is found in Robert M. White, *Introduction to Magnetic Recording*, IEEE Press, 1985.

Figure 2:
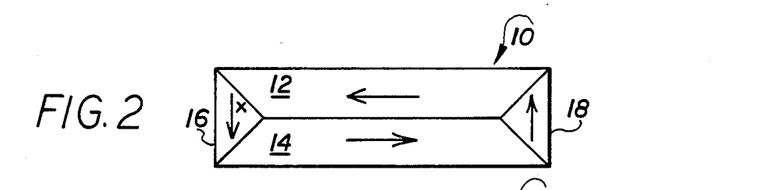
FIG. 2 is a representation of the domain orientation of a magnetoresistive material where no magnetic field is applied.
Figure 3:
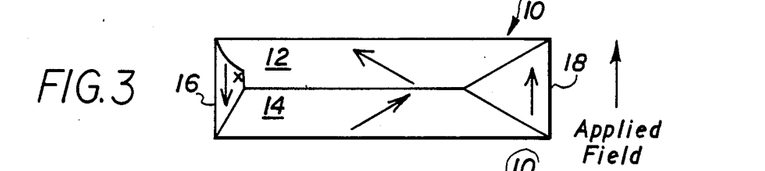
FIG. 3 is a representation of the domain orientation of a magnetoresistive material where a magnetic field is applied, and wall motion is hindered by a point defect.
Figure 4:
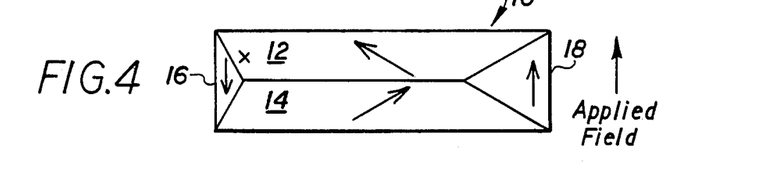
FIG. 4 is a representation of the domain orientation of a magnetoresistive material where a magnetic field is applied, and the wall has overcome the point defect.

A significant problem that exists with the use of MR heads is Barkhausen noise. Barkhausen noise is caused by the sudden and erratic motion of the domain walls separating different magnetic domains in the magnetoresistive element. Experiments by C. Tsang and S. K. Decker, "Study of Domain Formation in Small Permalloy Magnetoresistive Elements", *Journal of Applied Physics*, Vol. 53, March, 1983, pp. 2602–2604, indicated that longitudinal demagnetization effects are the main cause of the domain formation. The Barkhausen noise caused by the sudden and erratic motion of the domain walls interferes with the signal being detected by the MR head and can cause erroneous reading of digitally recorded data or additive noise on analog recordings. FIGS. 2–4 are a schematic representation of Barkhausen Noise. In FIG. 2 the MR element 10 is shown in its lowest energy or zero field state with no external field applied. In the zero field state, for instance, the permalloy bar breaks up into two large domains 12, 14 antiparallel to one another with orientation along the direction requiring least energy or the easy direction and two smaller closure domains 16, 18 at the ends of the MR element.

Notice that the MR element 10 in FIGS. 2–4 has a point defect x in the left hand closure domain 16. In FIG. 3 a field has been applied to the MR head normal to its easy axis. This applied field causes the right hand closure domain 18 to increase in area while the left hand closure domain decreases in area. The field also causes the magnetization in the two large domains to rotate. Because the wall cannot smoothly move across the point defect in the left hand closure domain, a buckle results in the wall as shown in FIG. 3. If the field is further increased, the wall will eventually overcome th point defect, but when this occurs the wall "jumps" across the defect resulting in a large instantaneous change in magnetization. This instantaneous change results in a spike in the MR head output which is termed Barkhausen Noise.

Applying a longitudinal bias field to the MR sensor can cause the permalloy bar to orient all of its moment along the applied field direction resulting in a single domain state. The magnitude of longitudinal bias field required is dependent on the aspect ratio (L/H) (where L is length and H is height) of the MR element and the height of the sensor.

Many different methods of producing the required longitudinal bias field have been suggested, see, C. Tsang, "Magnetics of Small MR Sensors), IBM Research Report, 1983. Exchange biasing is capable of producing lognitudinal bias fields large enough to force the sensor to remain in a single domain state even with zero applied field, thus reducing all changes in magnetization to rotation about the easy axis, and eliminating Barkhausen Noise. For example, it has been shown that the erratic domain wall motion responsible for Barkhausen Noise in small magnetoresistive sensors can be suppressed by exchange biasing the permalloy layer with antiferromagnetic FeMn. See, C. Tsang and R. E. Fontana, Jr., "Fabrication and Wafer Testing of Barber-Pole and Exchange-Biased Narrow-Track MR Sensors", *IEEE Transacitons on Magnetics*, Vol. MAG -18, November 1983, pp. 1149–1151. Tsang, et al. have shown that for MR sensors with dimensions of 10 $\mu m \times 15$ $\mu m$ an effective bias field, or exchange field ($H_E$), of greater than 15 Oe is required to stabilize the domains. It has also been shown by C. Tsang and Kenneth Lee, "Temperature Dependence of Unidirectional Anisotropy Effects in the Permalloy-FeMn Systems", *Journal of Applied Physics*, Vol. 53, March 1982, pp. 2605–2607 that as the exchange coupled NiFe-FeMn films are heated, the magnitude of $H_E$ drops linearly to zero at about 150° C. See FIG. 5 which is a comparison of $H_E$ versus temperature for different exchange systems. If a NiFe-FeMn exchange biased head were to heat up due to contact with the media or by some other means, the longitudinal bias field would decrease, resulting in domain motion, noise, and change in sensitivity. This essentially eliminates the effectiveness of such an exchange biased head.

To more fully understand and appreciate the concept of exchange biasing as used above the concept of exchange anisotropy must be understood. Exchange anisotropy is a term that describes an interface phenomenon that occurs between magnetic materials. Exchange anisotropy typically occurs in ferromagnetic-antiferromagnetic systems, but has also been seen in ferromagnetic-ferrimagnetic-antiferromagnetic systems.

Figure 6:
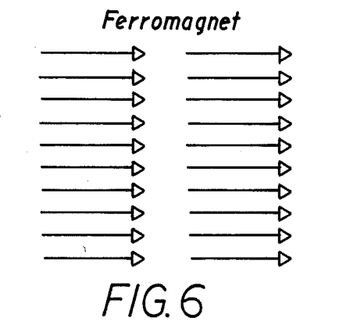
FIG. 6 is a representation of the spin direction in a ferromagnet.
Figure 7:
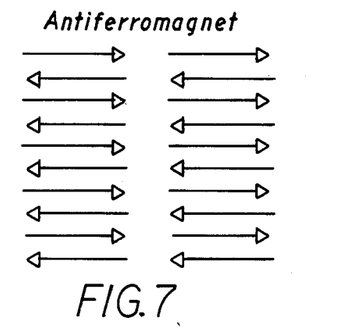
FIG. 7 is a representation of the spin direction in an antiferromagnet.

In a ferromagnetic material, the spins of adjacent layers of atoms experience an exchange interaction which causes them to align parallel to one another. In an antiferromagnetic material however, the spins of adjacent atomic layers experience an exchange interaction which causes the spins of adjacent layers to align antiparallel. Since the magnetic moment of all lattice planes in the antiferromagnet are equal, the antiparallel arrangement of spins results in a material which has no net magnetic moment. FIGS. 6 and 7 schematically represent the direction of the spins of adjacent planes of atoms for ferromagnetic and antiferromagnetic systems.

Figure 8:
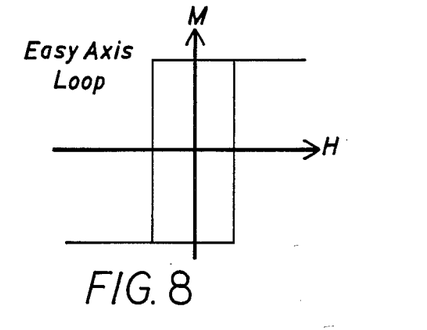
FIG. 8 is a graph of the easy axis loop for a uniaxial material.
Figure 9:
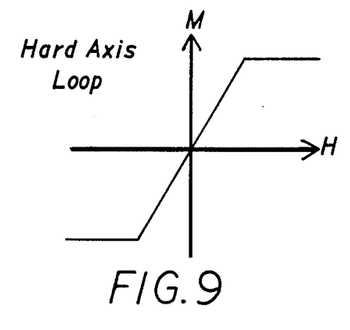
FIG. 9 is a graph of the hard axis loop for a uniaxial material.

Anisotropy is a term that describes the preference of a material to be magnetized along particular geometric directions. This preference is due to the fact that the internal energy of the cyrstal differs when the spontaneous moments of the atoms are directed along different crystallographic axes. A magnetic material that has one axis of preferred magnetization is said to exhibit uniaxial anisotropy. Deposition of a material that exhibits uniaxial anisotropy in a D.C. magnetic field reduces dispersion of the zero field magnetization and defines the uniaxial anisotropy direction to be along the applied field direction. FIGS. 8 and 9, respectively, show M-H loops along the easy (parallel to anisotropy direction) and hard (perpendicular to anisotropy direction) and hard (perpendicular to anisotropy diredion directions of a material that exhibits uniaxial anisotropy.

If an antiferromagnetic material is deposited on top of a ferromagnetic material in the same applied DC magnetic field that the ferromagnet was deposited, the spins of the atoms of the first layer of the antiferromagnet will align with the applied field and couple directly (align parallel) with the spins of the surface atoms of the ferromagnetic mateiral. The direction in which the spins of the atoms of both the ferromagnet and antiferromagnet couple at the interface is called the unidirectional anisotropy direction. The next plane of deposited antiferromagnetic atoms experiences an exchange interaction with the first plane of antiferromagnetic atoms which aligns its spins antiparallel to the unidirectional anisotropy direction. Subsequent antiferromagnetic layers will alternate directions as mentioned previously.

In order to describe what the M-H loop of such an exchange coupled magnetic film would look like, it is necessary to make a few assumptions. First, it is assumed that the applied magnetic field of a measuring device, such as a M-H loop tracer, is large enough to staturate the ferromagnetic material. Second, it is assumed that the anisotropy of the antiferromagnetic material is large enough that the direction of its spins will not be changed by the field of the measuring device. Finally, in order to easily observe the exchange effect, both the Curie temperature of the ferromagnet and the Neel temperature of the antiferromagnet must be greater than room temperature.

Figure 10:
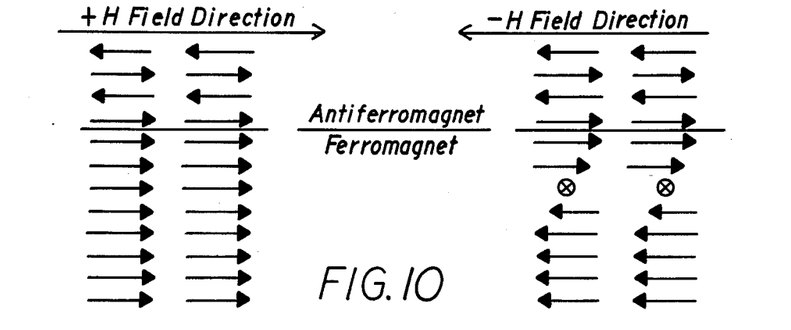
FIG. 10 is a representation of the spin direction in an exchange coupled film where the unidirectional axis is parallel to a +H field.
Figure 11:
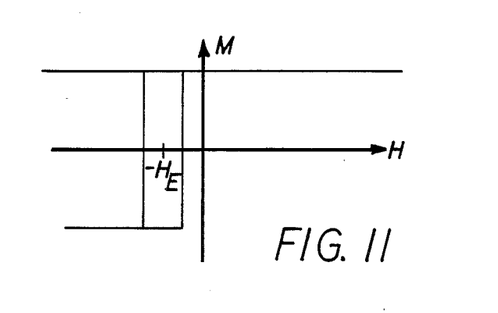
FIG. 11 is a graph of a hysterisis loop of an exchange couple film.

The bilayer exchange coupled film is placed in a M-H loop tracer with its unidirecitonal anisotropy direction aligned with the +H field direction of the loop tracer. FIGS. 10 and 11, respectively, shown the spin arrangement in the bilayer film, along with the resultant M-H loop. In order to obtain the M-H loop shown, the loop tracer first sweeps the H field to some positive value at which the ferromagnetic material is saturated. Saturation in the +H field is indicated by some value +M$_S$. The loop tracer field is decreased to zero field, then it is swept in the negative direction. As the loop tracer field becomes more negative, the ferromagnet eventually saturates in the minus M direction. Since the antiferromagnetic mateiral remains unchanged during this reversal, and the surface spins of the ferromagnetic material are coupled directly to the antiferromagnet by a strong direct exchange interaction, the surface spins of the ferromagnet cannot align with the loop tracer field, causing a twist in the magnetization of the ferromagnet (magnetic domain wall). This induced domain wall results in a high field energy requirement ot saturate the ferromagnet in the $-M$ direction. If the loop tracer field is now swept back towards zero, the energy stored in the induced domain wall will cause the magnetization of the ferromagnet to switch back to the $+M$ direction at a value of H field which is less than that required for saturation in the $-M$ direction. In some cases the magnetization can switch from minus to plus even before the applied field crosses zero. This asymmetrical switching field results in the characteristic shifted hysteresis loop of exchange coupled films. The value of the H field at the effective center of the shifted hysteresis loop is called the exchange field ($H_E$).

It is now apparent why the direction of the spins of the atoms at the bilayer interface is called the unidirectional anisotropy direction; this is because the bilayer material favors magnetization in this one direction alone.

Essentially, as mentioned above, the materials that are currently available for providing exchange biasing are too temperature dependent. A maerial that is not as temperature dependent and which provides a stronger exchange biasing field than currently used materials is needed.

Figure 12:
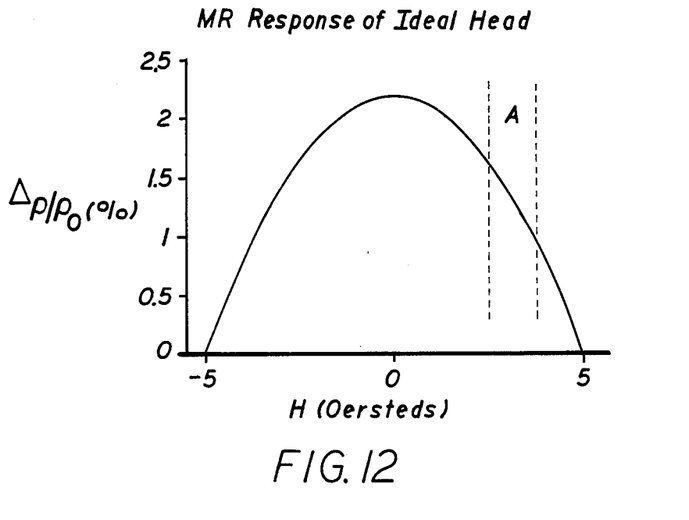
FIG. 12 is a graph of the change in resistivity versus the applied field.

An additional kproblem with MR head sis the fact that the resistivity as a function of the applied magnetic field is not continuously linear. More exactly, referrring to FIG. 12, the change in resistivity $\Delta \rho/\rho$ as a function of H is nonlinear and maximally flat about zero field. To obtain maximum sensitivity while maintaining good linearity it is desirable to shift the curve depicted in FIG. 12 so the steepest and most linear portion of the curve, A, is shifted to the zero-field point. Since the curve is not very steep at the zero-field point of the unshifted curve, only a large change in applied field will result in a detectable difference in response. One technique used to linearize the MR response is the use of a barber-pole which provides a transverse field to the MR head, causing the curve to shift so point A is at or near zero external field. See, C. Tsang and R. E. Fontana, Jr., "Fabrication and Wafer Testing of Barber-Pole and Exchange-Biased Narrow-Track MR Sensors", *IEEE Transactions on Magnetics,* Vol. MAG-18, No. 6, November, 1982. Ideally, what is desired is a single method that provides a strong enough biasing field in both longitudinal and transverse directions of the MR head to overcome Barkhausen noise and shift the sensitivity, simultaneously. V. A. Seredkin, G. I. Frolov, and V. Yu. Yakovchuk, *Sov. Tech. Phys. Lett.,* 9 (12), December 1983 have shown that exchange anisotropy exists in a multilayer NiFe-TbFe film structure.

SUMMARY OF THE INVENTION

The present invention pertains to a magnetoresistive (MR) sensor element. The invention comprises a first layer that has a high permeability, a uniaxial anisotropy, is magnetically soft (having a coercivity less than 50 oersteds) and which exhibits a magnetoresistive response, and a second layer made of a rare earth transition metal which is preferably amorphous and which provides an exchagne bias to the first layer. The second layer contacts the first layer. Additionally, a substrate that is electrically insulating and thermally conductive, contacts the first layer, with the first layer situated between the substrate and the second layer. Of course, the first and second layers are interchangeable.

A second embodiment of the invention is an MR sensor element comprising a first layer that has a high permeability, a uniaxial anisotropy, a coercivity of less than 50 oersted and which exhibits a magnetoresistive response. A second layer contacts the first layer and provides a magnetic biasing field of at least 5 oersteds at 85° C. to the first layer. Also, a substrate that is electrically insulating and thermally conducting contacts the first layer, with the first layer located between the substrate and the second layer. Again, the first and second layers are interchangeable.

A more preferred embodiment includes an MR sensor element wherein the first layer is made of NiFe, the second layer is made of TbCo, and the second layer is positioned with respect to the first layer such that the exchange bias has both transverse and longitudinal components.

BRIEF DESCRIPTION OF DRAWINGS

A more complete appreciation of the present invention and many of the attendant advantages thereof will be readily obtained as the same become better understood by reference to the following detailed descriptions when considered in connection with the accompanying drawings, wherein.

DESCRIPTION OF THE PREFERRED EMBODIMENTS

Figure 1A:
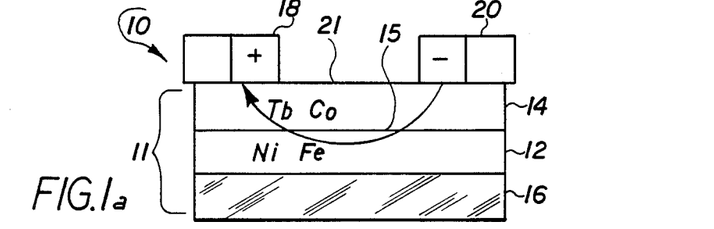
FIGS. 1a and 1b are an overhead and crosssectional view of an MR sensor.
Figure 1B:
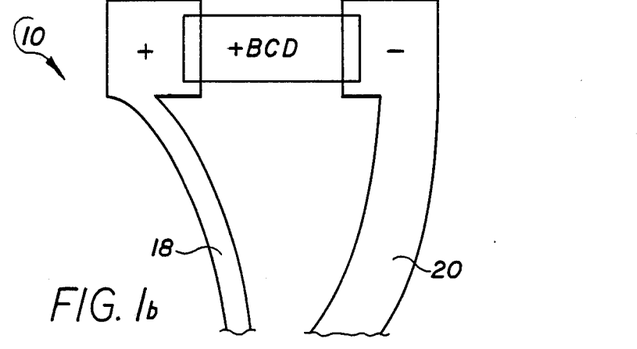

Referring now to the drawings, wherein like reference numerals designate identical or corresponding parts throughout the several view, and more particularly to FIGS. 1a and 1b, there is shown an MR sensor 10. The MR sensor 10 includes an element having a first layer 12 that exhibits a magnetoresistive response, a second layer 14 with a side 15 that magnetically biases the first layer 12 and is in contact therewith, and a substrate 16 that contacts the first layer 12, with the first layer 12 disposed between the second layer 14 and the substrate 16. Adjoining the side 21 of the second layer is an anode contact 18 and a cathode contact 20. The anode contact 18 and the cathode contact 20 are positioned on the side 21 of the second layer 14 such that they do not contact each other.

More specifically, the first layer 12 is the component of the MR sensor element 11 which is responsive to the magnetic field produced by the magnetic storage material containing the information to be read (not shown). The first layer 12 should be made of a material that has a high permeability, a uniaxial anisotropy, exhibits a magnetoresistive response and is magnetically soft. To be magnetically soft, a material should have a coercivity under 50 oersteds. Preferably, the material used for the first layer is NiFe, and specifically 80% Ni, 20% Fe. Such a ratio of these materials is known as permalloy ™.

Figure 5:
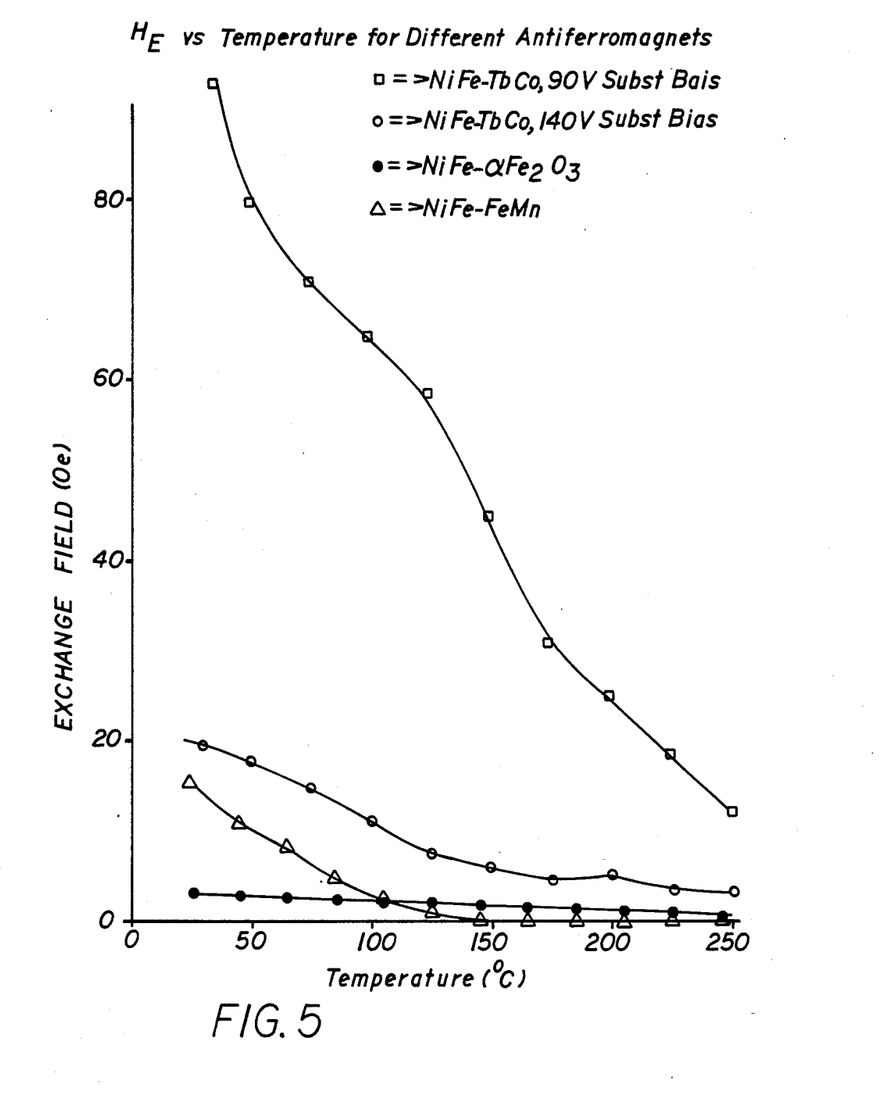
FIG. 5 is a comparison of $H_E$ vs. temperature for different exchange systems.

The second layer contacts the first layer and is made of a material that exchange biases the first layer. The exchange biasing of the first layer by the second layer serves to at least provide domain stabilization and preferably also provide linearization to the first layer and provide for a single domain state therein over the effective operational temperatures of the first layer. In other words, an exchange biasing field of at least 10oersteds is provided to the first layer 12 by the second layer 14 to an operational temperature of 100° C. Materials that satisfy these requirements are made by combining ferromagnetic transition metals with the rare earth elements forming rare earth-transition metal alloys. Preferably, TbCo is used for the second layer. FIG. 5 shows the temperature dependence of the exchange field $H_E$ produced as a function of temperature for an MR read element having a first and second layer of NiFe and TbCo, respectively.

The substrate 16 that contacts the first layer 12 should be a thermally conductive and electrically insulating material. The anode contact 18 and cathode contact 20 should be made of an electrically conducting material such as AlCu.

To produce the MR read element 11 deposition of materials was accomplished by R.F. sputtering. For example, the sputtering system used was a Perkin Elmer 2400 series R.F. sputter unit with an Ultek cryo-pump high vacuum system A schematic of a R.F. sputtering system is given in FIG. 13. Clean glass substrates 100 were placed in the high vacuum chamber 102 which was pumped down to $7 \times 10^{-7}$ Torr or less. Argon gas was then bled into the chamber 102 at a pressure of 2 to 40 mT. In the process of R.F. sputtering a filament ignites the argon atmosphere into a plasma which is sustained by a large R.F. voltage applied between the target to be sputtered and the chamber. Since the applied voltage is at a high frequency, the plasma does not have sufficient time to become deionized. The target voltage is actually an offset R.F. sinusoid of 13.6 MHz whose average value is negative. Under the actions of Coulomb forces, the positively charged argon ions 104 are accelerated towards the negatively charged target 106 and through a "billiard ball" effect knock target atoms loose. The freed target atoms diffuse through the plasma and deposit on the substrate table 108 where they form layers of target material. In some cases it is desirable to apply a small negative bias voltage to the substrate table 108. This causes argon ions 104 to be accelerated towards the depositing film, resulting in resputtering of the material from the subtrates 100. The substrate bias is also an offset R.F. sinusoid with a negative offset of 1 to 200 Volts. The use of substrate bias voltage allows the composition and microstructure of deposited films to be altered signifcantly.

The materials used for sputtering are, preferably, either an alloy in the form of a solid zonerefined target such as $Ni_{80}Fe_{20}$, or a composite target which consists of a cast target such as cobalt with small squares of another material, such as termbium, bonded to it using a conductive silver epoxy. The "as sputtered" composition of the samples can differ from the target composition due to differences in the sputtering rates of elements. Sample composition and structure can be varied by changing the voltage applied to the target and the substrate table, and by varying the argon pressure.

Figure 13:
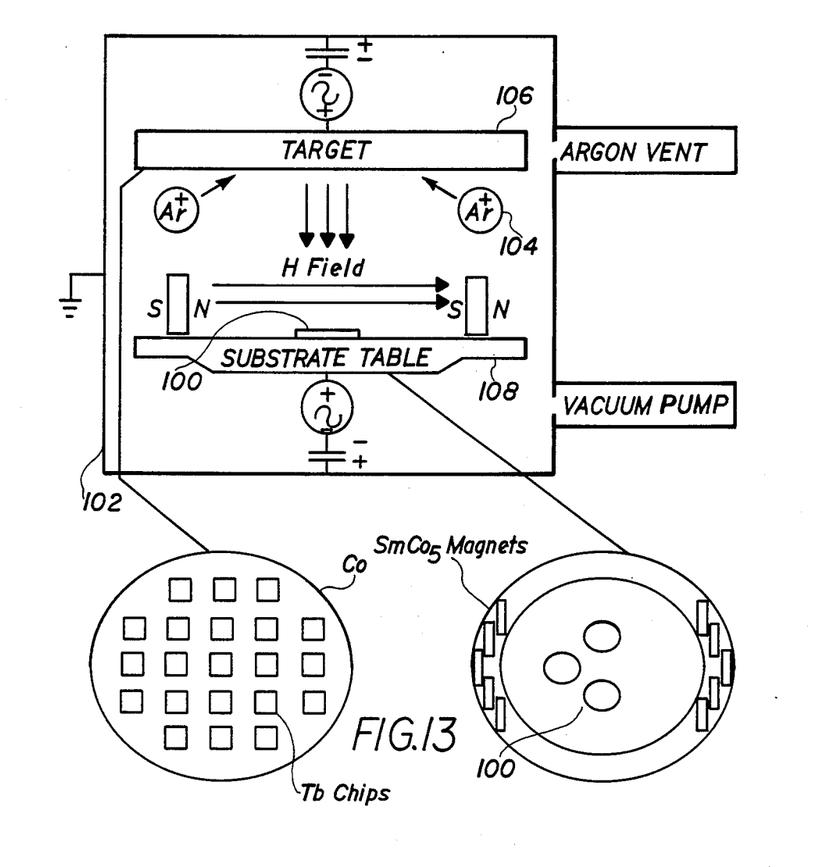
FIG. 13 is an RF sputtering deposition system.

Also shown on FIG. 13 is the configuration of the magnets that produce the D.C. magnetic field necessary for the orientation of the desired anisotropy direction. The D.C. magnetic field causes the magnetic atributes of the deposited material to tend to align in a common direction. The magnets are rectangles made of $SmCo_5$ and are magnetzied along their shortest dimension. They are mounted on a brass ring by silver epoxy. The field produced is uniform ($\pm 10\%$) over the area of the three substrates and is about 30 oersteds in magnitude.

Figure 14:
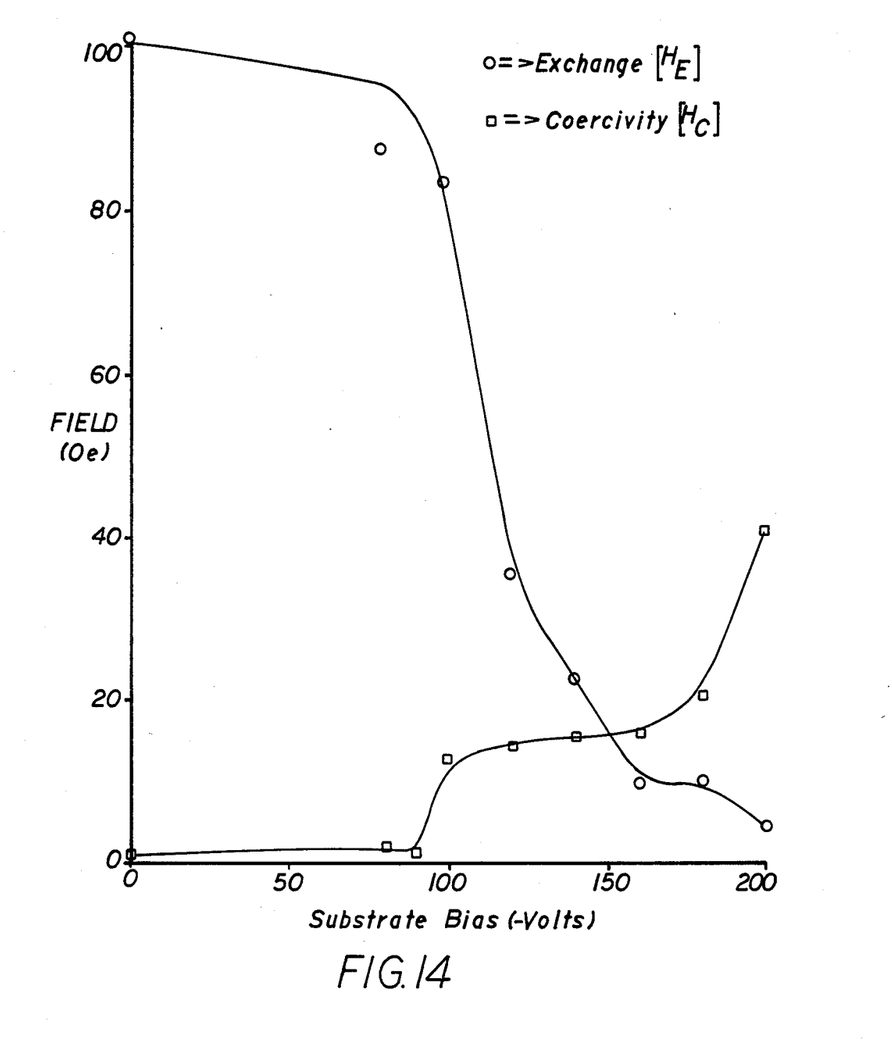
FIG. 14 is a graph of magnetic properties versus substrate bias for a NiFe-TbCo system.

The TbCo target used was a composite target consisting of a cobalt base on which squares of terbium foil were epoxied. For example, the cobalt base was six inches in diameter and 80–120 squares of terbium foil were epoxied to the cobalt base. The NiFe-TbCo films consist of a 410 A layer of permalloy on which TbCo is deposited with 40 mT of argon pressure at 350 Watts of forward power for four minutes, yielding a TbCo layer 1000 A thick. A negative bias voltage was also applied to the substrate table during TbCo deposition. This bias voltage ranged from zero to $-200$ volts. A thin layer of $SiO_2$ was then deposited on top of the TbCo to prevent oxidation. FIG. 14 is a plot of coercivity and exchange field for samples prepared by using different bias voltages. Note that at low bias voltages the coercivity is very low, and the exchange field is very large. As the bias is increased to 100 volts the coercivity rapidly increases and the exchange field starts to drop off rapidly.

Figure 15:
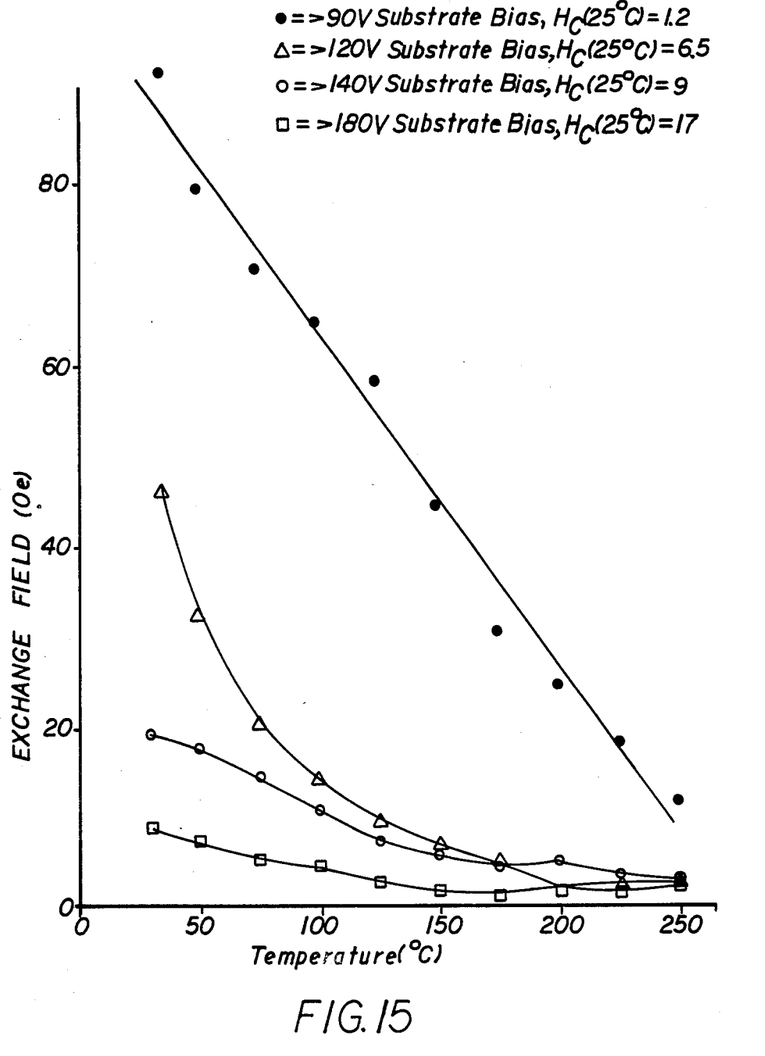
FIG. 15 is a graph of $H_E$ versus temperature for different substrate biases during TbCo deposition.

The exchange field of NiFe-TbCo samples deposited at different substrate bias voltages is plotted versus temperature in FIG. 15. Note that in all four samples the exchange field is non-vanishing up to 250° C. In the case of the sample biased at 90V, the exchange field is still 12 Oe at 250° C. The temperature coefficient of exchange is independent of substrate bias and is 0.38%/°C. for all NiFe-TbCo samples. All three samples that have rom temperature exchange fields greater than 5 Oe maintain at least 5 Oe of bias at 85° C. The room temperature coercivities of the sample biased at 90 and 120 volts are small enough to produce usable MR sensors.

Because the exchange anisotropy is so great between the rare earth transition metal layer and the high permeability layer, the second layer can be placed in a relationship with the first layer so there is both a longitudinal and transverse bias component applied to the first layer. This is important because, as mentioned above, the resistivity of the first layer is a function of the transverse bias. (The linearization of the first layer is responsive to the transverse bias.) Thus, the need, for instance, of a barber-pole is not required. For the exchange anisotropy to have a transverse and a longitudinal component the unidirectional anisotropy axis of the exchange coupled material should be located at an angle to the long axis of the MR sensor element. The desired resistivity shift can then be achieved by choosing the proper strengh of transverse bias by choosing the proper angle.

In the operation of the invention a current is introduced into the MR sensor element by way of cathode contact 20 and anode contact 18. Current flows much more easily through the first layer 12 than the rare earth transition metal layer forming an active area thereon. The active area defines the size of the track through which reading occurs. The resistance of the first layer varies due to the nature of the magnetoresistive response it exhibits. Sensors (not shown), detect the change in voltage due to the change in resistance from a change in the magnetic field of a magnetic storage medium that is being read.

Obviously, numerous (additional) modifications and variations of the present invention are possible in light of the above teachings. It is therefore to be understood that within the scope of the appended claims, the invention may be practiced otherwise than as specifically decribed herein.

What is claimed is:

1. A magnetoresistive readback sensorelement comprising:
    a first layer that has a high permeability, a uniaxial anisotropy, is magnetically soft and which exhibits a magnetoresistive response; and
    a second layer made of rare earth transition metal which provides a magnetic bias field to the first layer, said second layer contacting the first layer.

2. A magnetoresistive readback sensor element comprising:
    a first layer that has a high permeability, a uniaxial anisotropy, is magnetically soft and which exhibits a magnetoresistive response; and
    a second layer contacting the first layer providing a magnetic biasing field of at least 5 oersteds at 85° C. to the first layer.

3. A magnetoresistive readback sensor element as described in claim 1 including a substrate that is electrically insulating and thermally conductive, said substrate contacting the first layer, with the first layer situated between the substrate and the second layer.

4. A magnetoresistive readback sensor element as described in claim 2 including a substate that is electrically insulting and thermally conductive, said substrate contacting the first layer, with the first layer situated between the substrate and the second layer.

5. A magnetoresistive readback sensor element as described in claim 1 including a substrate that is electrically insulating and thermally conducting, said substrate contacting the second layer, with the second layer located between the substrate and the first layer.

6. A magnetoresistive readback sensor element as described in claim 2 including a substrate that is electrically insulating and thermally conducting, said substrate contacting the second layer, with the second layer located between the substrate and the first layer.

7. A magnetoresistive readback sensor element as described in claim 3 wherein the first layer is made of NiFe.

8. A magnetoresistive readback sensor element as described in claim 4 wherein the first layer is made of NiFe.

9. A magnetoresistive readback sensor element as described in claim 5 wherein the first layer is made of NiFe.

10. A magnetoresistive readback sensor element as described in claim 6 wherein the first layer is made of NiFe.

11. A magnetoresistive readback sensor element as described in claim 7 wherein the second layer is TbCo.

12. A magnetoresistive readback sensor element as described in claim 8 wherein the second layer is TbCo.

13. A magnetoresistive readback sensor element as described in claim 9 wherein the second layer is TbCo.

14. A magnetoresistive readback sensor element as described in claim 10 wherein the second is TbCo.

15. A magnetoresistive readback sensor element as described in claims 1, 2, 11, 12, 13 or 14 wherein the first and second layers are positioned with respect to the sensor geometry such that the magnetic bias field has a transverse and a longitudinal component.

16. A magnetoresistive readback sensor element as described in claim 15, including an anode contact and a cathode contact intimately connected to the sensor element such that there is a predetermined active area therein.

17. A magnetoresistive readback sensor element as described in claim 1, wherein the rare earth transition metal is amorphous.

* * * * *